(12) United States Patent
Jeung

(10) Patent No.: US 6,798,700 B2
(45) Date of Patent: Sep. 28, 2004

(54) METHODS OF READING AND/OR WRITING DATA TO MEMORY DEVICES INCLUDING MULTIPLE WRITE CIRCUITS AND/OR VIRTUAL GROUND LINES AND RELATED DEVICES

(75) Inventor: Seong-ho Jeung, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/718,344

(22) Filed: Nov. 20, 2003

(65) Prior Publication Data

US 2004/0076065 A1 Apr. 22, 2004

Related U.S. Application Data

(62) Division of application No. 10/123,601, filed on Apr. 16, 2002, now Pat. No. 6,674,670.

(30) Foreign Application Priority Data

May 7, 2001 (KR) ........................................ 2001-24685

(51) Int. Cl.$^7$ .............................................. G11C 16/04
(52) U.S. Cl. .............. 365/189.01; 365/154; 365/230.05
(58) Field of Search ........................... 365/189.01, 154, 365/156, 230.05, 189.04

(56) References Cited

U.S. PATENT DOCUMENTS

| 5,448,518 | A | | 9/1995 | Jinbo |
| 5,477,489 | A | | 12/1995 | Wiedmann |
| 5,561,638 | A | | 10/1996 | Gibson et al. |
| 5,590,087 | A | * | 12/1996 | Chung et al. .......... 365/230.05 |
| 5,717,638 | A | | 2/1998 | Kim |
| 5,734,613 | A | | 3/1998 | Gibson |
| 5,901,079 | A | * | 5/1999 | Chiu et al. .................. 365/154 |
| 5,973,985 | A | | 10/1999 | Ferrant |
| 6,091,627 | A | | 7/2000 | Luo et al. |
| 6,104,663 | A | | 8/2000 | Kablanian |
| 6,108,233 | A | | 8/2000 | Lee et al. |
| 6,147,898 | A | | 11/2000 | Yamada |
| 6,400,635 | B1 | | 6/2002 | Ngai et al. |

FOREIGN PATENT DOCUMENTS

| JP | 7057487 | 3/1995 |
| JP | 07-057487 | 3/1995 |

* cited by examiner

Primary Examiner—Anh Phung
(74) Attorney, Agent, or Firm—Myers Bigel Sibley & Sajovec

(57) ABSTRACT

Methods can be provided for reading data from a memory device comprising a plurality of memory cells and a plurality of virtual ground lines wherein each memory cell comprises a latch circuit coupled to a read circuit and wherein each virtual ground line is coupled with read circuits of a respective group of memory cells. Methods for reading according to embodiments of the present invention can include selecting a memory cell from which data is to be read, applying a first reference voltage to a virtual ground line coupled to the selected memory cell from which data is to be read, and applying a second reference voltage to a virtual ground line not coupled to the selected memory cell. A read word line coupled to the read circuit of the selected memory cell from which data is to be read can be activated. Responsive to activating the read word line coupled to the read circuit of the selected memory cell from which data is to be read, data can be coupled from the latch circuit of the selected memory cell with a respective read bit line through the read circuit of the selected memory cell. Methods of writing are also discussed, as are related memory devices and cells.

19 Claims, 4 Drawing Sheets

METHODS OF READING AND/OR WRITING DATA TO MEMORY DEVICES INCLUDING MULTIPLE WRITE CIRCUITS AND/OR VIRTUAL GROUND LINES AND RELATED DEVICES

RELATED APPLICATION

This application claims the benefit as a divisional of U.S. patent application Ser. No. 10/123,601, filed Apr. 16, 2002, now U.S. Pat. No. 6,674,670, issued on Jan. 6, 2004, the disclosure of which is hereby incorporated herein by reference in its entirety as if set forth fully herein. This application also claims the benefit of Korean Patent Application No. 2001-24685, filed May 7, 2001, the disclosure of which is hereby incorporated herein by reference in its entirety as if set forth fully herein.

FIELD OF THE INVENTION

The present invention relates to semiconductor devices, and more particularly, to semiconductor memory devices and related methods.

BACKGROUND OF THE INVENTION

FIG. 1 is a diagram illustrating a conventional semiconductor memory cell connected to a write word line and a read word line. Referring to FIG. 1, the conventional semiconductor memory cell connected to a write word line AWWL1 and a read word line ARWL1 includes a latch circuit A120, a write circuit A140, a first read circuit A110, and a second read circuit A130.

The latch circuit A120 includes two PMOS transistors AP1 and AP2 and two NMOS transistors AN1 and AN2, thereby latching a predetermined external voltage applied to a first node AND1. The write circuit A140 transmits a predetermined voltage loaded in a write bit line AWBL1 to the first node AND1 of the latch circuit A120 in response to the write word line AWWL1.

The first read circuit A110 inverts the voltage level at the first node AND1 in response to the read word line ARWL1 and transmits the voltage to a read bit line ARBL1. The second read circuit A130 inverts the voltage level at a second node AND2 in response to the read word line ARWL1 and transmits the voltage to a complementary read bit line ARBLB1.

The conventional semiconductor memory device of FIG. 1 includes a plurality of semiconductor memory cells arranged in row and column directions.

FIG. 2 is a diagram illustrating a conventional semiconductor memory cell connected to a write word line and two read word lines. Referring to FIG. 2, the conventional semiconductor memory cell connected to a write word line AWWL1 and two read word lines ARWL1 and ARWL2 includes a latch circuit A220, a write circuit A240, a first read circuit A210, and a second read circuit A230.

The latch circuit A220 includes two PMOS transistors AP1 and AP2 and two NMOS transistors AN1 and AN2, thereby latching a predetermined external voltage applied to a first node AND1. The write circuit A240 transmits a predetermined voltage loaded in a write bit line AWBL1 to the first node AND1 of the latch circuit A220 in response to the write word line AWWL1.

The first read circuit A210 inverts the voltage level of the first node AND1 in response to a first read word line ARWL1 and/or a second read word line ARWL2 and transmits the voltage to a first read bit line ARBL1 and/or a second read bit line ARBL2. The second read circuit A230 inverts the voltage level of a second node AND2 in response to a first read word line ARWL1 and/or a second read word line ARWL2 and transmits the voltage to a first complementary read bit line ARBLB1 and/or a second complementary read bit line ARBLB2. The conventional semiconductor memory device of FIG. 2 includes a plurality of semiconductor memory cells arranged in row and column directions.

Referring to FIG. 1, the operation of the conventional semiconductor memory cell will be described. In a case where a logic high state "H" is recorded at the first node AND1 of the latch circuit A120, the write word line AWWL1 is controlled to activate the write circuit A140, the first node AND1 is charged with an electrical charge representing the state "H" of the write bit line AWBL1 through the write circuit A140.

In a case where a logic low state "L" is recorded at the first node AND1 of the latch circuit A120, the write word line AWWL1 is controlled to activate the write circuit A140, and an electrical charge stored in the first node AND1 is discharged into the write bit line AWBL1 through the activated write circuit A140.

The voltage level at the first node AND1 and/or the second node AND2 of the latch circuit A140 is output to an external device through the read bit line ARBL1 and the complementary read bit line ARBLB1 through the first read circuit A110 and/or the second read circuit A130.

Responsive to a signal of the read word line ARWL1, the first read circuit A110 inverts the voltage level at the first node AND1 and transmits the voltage level to the read bit line ARBL1. Since the read bit line ARBL1 is pre-charged to the state "H", the voltage level of the read bit line ARBL1 is not changed if the voltage level at the first node AND1 is in the state "H". However, if the voltage level at the first node AND1 is in the state "L", an electrical charge of the read bit line ARBL1 is discharged into a supply voltage Vss through transistors AN5 and AN3 of the first read circuit A110, and thus, the first read bit line ARBL1 represents the state "L".

The second read circuit A130 responding to a signal of the read word line ARWL1 inverts the voltage level at the second node AND2 and transmits the voltage to a first complementary read bit line ARBLB1. A method for inverting the voltage level of the second node AND2 and transmitting the voltage to the first complementary read bit line ARBLB1 is the same as a method for reading the voltage level at the first node AND1 by using the first read circuit A110.

The conventional semiconductor memory cells shown in FIGS. 1 and 2, however, may have disadvantages. If the first write word line AWWL1 is selected from a plurality of write word lines AWWL1 through AWWLN (not shown) and is in a state "H", for example, a plurality of latch circuits A140 and A240, which are controlled by the first write word line AWWL1, are all activated. The voltage level of the write bit line AWBL1 should be applied only to the latch circuits A120 and A220 which are connected to one write circuit from the plurality of write circuits A140 and A240. However, charge re-distribution may occur even in the latch circuits A120 and A220 which are connected to the other write circuits. Thus, errors such as data being recorded in an unselected semiconductor memory cell may occur.

In a case where the read word lines ARWL1 and/or ARWL2 are in the state "H" during a read operation, one of the read bit line pairs ARBL1 and/or ARBL2 which has been already charged to the state "H" may be discharged regardless of the data stored in the latch circuits A120 and A220, resulting in unnecessary power consumption. This is a reason the first node AND1 and the second node AND2 have opposite voltage levels.

In addition, if charges of the second read bit line ARBL2 and the second complementary read bit line ARBLB2 are increased (see FIG. 2), assuming that the first read word line ARWL1 and the second read word line ARWL2 are simultaneously in the state "H", an effective capacitance of a third node AND3, which is connected to both read bit lines ARBL1 and ARBL2, may increase, thereby increasing read time.

SUMMARY OF THE INVENTION

According to embodiments of the present invention, methods can be provided for reading data from a memory device comprising a plurality of memory cells and a plurality of virtual ground lines wherein each memory cell comprises a latch circuit coupled to a read circuit and wherein each virtual ground line is coupled with read circuits of a respective group of memory cells. Methods for reading according to embodiments of the present invention can include selecting a memory cell from which data is to be read, applying a first reference voltage to a virtual ground line coupled to the selected memory cell from which data is to be read, and applying a second reference voltage to a virtual ground line not coupled to the selected memory cell. A read word line coupled to the read circuit of the selected memory cell from which data is to be read can be activated. Responsive to activating the read word line coupled to the read circuit of the selected memory cell from which data is to be read, data can be coupled from the latch circuit of the selected memory cell with a respective read bit line through the read circuit of the selected memory cell.

According to additional embodiments according to the present invention, methods can be provided for writing data to a memory device comprising a plurality of memory cells, wherein each memory cell comprises a latch circuit having first and second complementary latch outputs and first and second write circuits respectively coupled to said first and second latch outputs. Methods for writing according to embodiments of the present invention can include selecting a memory cell to which data is to be written, activating a write word line coupled to the first and second write circuits of the selected memory cell to which data is to be written, and applying complementary write values to complementary write bit lines of a write bit line pair coupled with the first and second write circuits of the selected memory cell. Responsive to activating the write word line coupled to the first and second write circuits of the selected memory cell to which data is to be written, the first and second latch outputs of the selected memory cell can be coupled with the complementary write bit lines of the write bit line pair coupled therewith to write the complementary write values to the first and second latch outputs of the selected memory cell.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 3:
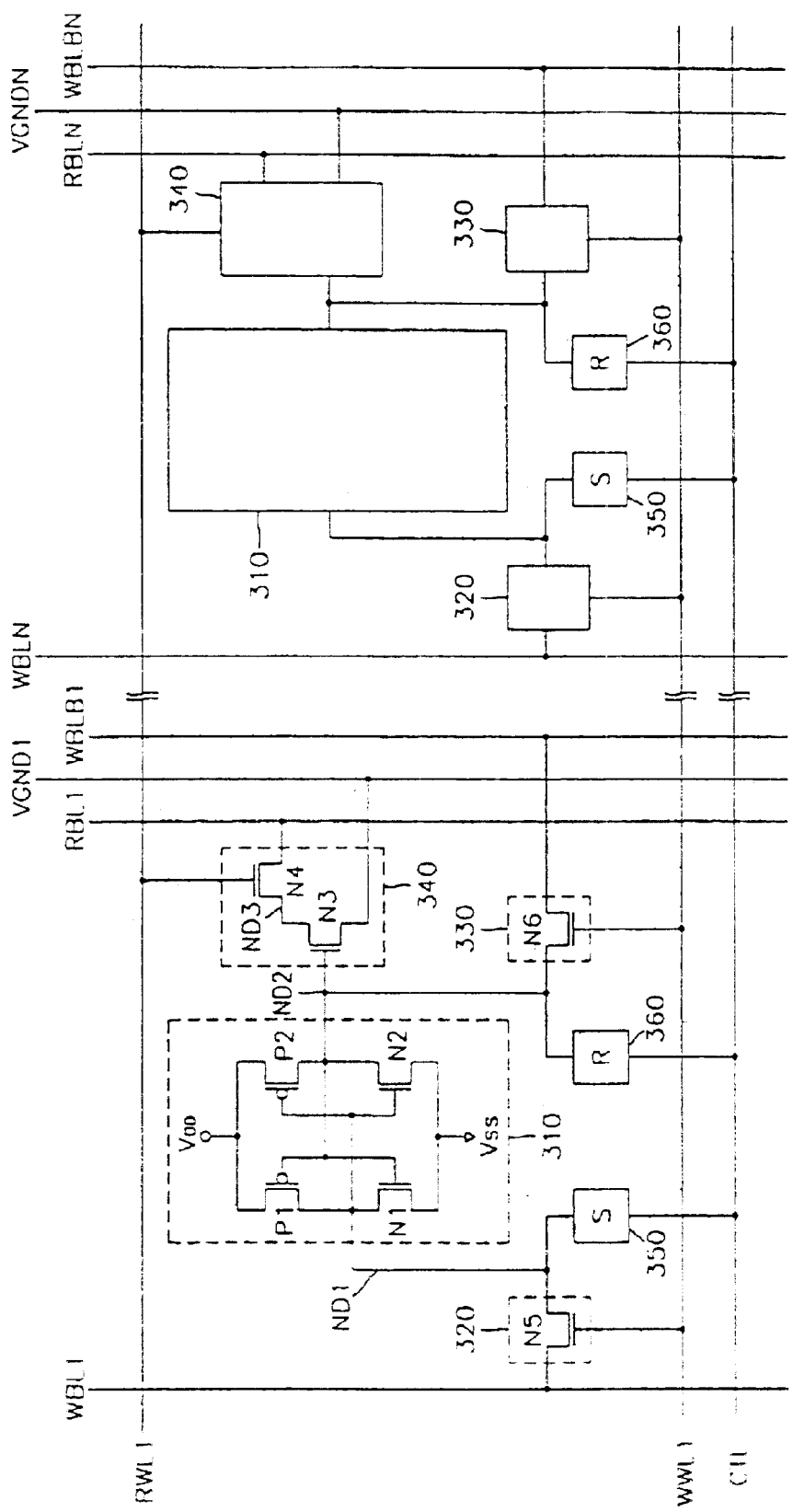
FIG. 3 is a diagram illustrating a semiconductor memory cell according to embodiments of the present invention.

FIG. 3 is a diagram illustrating an embodiment of a semiconductor memory cell according to the present invention. Referring to FIG. 3, the semiconductor memory cell includes a latch circuit 310, a first write circuit 320, a second write circuit 330, a read circuit 340, a set circuit 350, and a reset circuit 360.

The latch circuit 310 latches two predetermined voltages which are applied to a first node ND1 and a second node ND2 as input/output terminals. The two voltages are logically opposite to each other, and thus the first node ND1 and the second node ND2 have opposite voltage levels. The latch circuit 310 includes first and second PMOS transistors P1 and P2 and first and second NMOS transistors N1 and N2.

The first PMOS transistor P1 has one source/drain connected to a supply voltage $V_{DD}$, another source/drain connected to the first node ND1, and a gate connected to the second node ND2. The second PMOS transistor P2 has one source/drain connected to a supply voltage $V_{DD}$, another source/drain connected to the second node ND2, and a gate connected to the first node ND1. The first NMOS transistor N1 has one source/drain connected to another supply voltage $V_{ss}$, another source/drain connected to the first node ND1, and a gate connected to the second node ND2. The second NMOS transistor N2 has one source/drain connected to the supply voltage $V_{ss}$, another source/drain connected to the second node ND2, and a gate connected to the first node ND1.

The first write circuit 320 transmits a first external voltage loaded in a first write bit line WBL1 to the first node ND1 in response to a signal of a first write word line WWL1. For this purpose, the first write circuit 320 includes a fifth NMOS transistor N5, which has one source/drain connected to the first write bit line WBL1, another source/drain connected to the first node ND1, and a gate connected to the first write word line WWL1.

The second write circuit 330 transmits a second external voltage loaded in a first complementary write bit line WBLB1 to the second node ND2 in response to a signal of the first write word line WWL1. For this purpose, the second write circuit 330 includes a sixth NMOS transistor N6, which has one source/drain connected to the first complementary write bit line WBLB1, another source/drain connected to the second node ND2, and a gate connected to the first write word line WWL1.

The read circuit 340 inverts the voltage level at the second node ND2 in response to a first read word line RWL1 and transmits the voltage to a first read bit line RBL1. For this purpose, the read write circuit 340 includes a fourth NMOS transistor N4, which has one source/drain connected to the first read bit line RBL1 and a gate connected to the first read word line RWL1, and a third NMOS transistor N3, which has one source/drain connected to the other source/drain of the fourth NMOS transistor N4, another source/drain connected to a first virtual ground VGND1, and a gate connected to the second node ND2.

The first virtual ground VGND1 is supplied by a multiplexer (not shown) responding to an address (not shown) and has ground voltage in a case where the first virtual ground VGND1 is connected to a semiconductor memory cell selected from a plurality of semiconductor memory cells and has supply voltage $V_{DD}$ in a case where the first virtual ground VGND1 is connected to an unselected semiconductor memory cell.

The set circuit 350 sets the first node ND1 to a high state "H", and the reset circuit 360 sets the second node ND2 to a low state "L", and the set circuit 350 and the reset circuit 360 are controlled by a control signal CTL. A plurality of semiconductor memory cells according to the present invention are arranged in a column direction and a row direction in a semiconductor memory device.

Operation of the semiconductor memory cell according to the present invention will be described with reference to FIG. 3. First, operations for recording data in the latch circuit 310 will be described. If the first write word line WWL1 is selected from a plurality of write word lines WWL1 through WWLN (not shown) and is in the state "H", the plurality of write circuits 320 and 330 controlled by the first write word line WWL1 are all activated. On the other hand, only a selected write bit line WBL1 or WBLB1 is activated to a desired voltage level while write bit lines WBL2 through WBLBN are maintained at a high state in the plurality of write circuits 320 and 330.

In order to charge the first node ND1 to a high state and discharge the second node ND2 to a low state, the first write bit line WBL1 is in the high state, and the first complementary write bit line WBLB1 is in the low state. If the first node ND1 is already in the high state, an electrical charge at the first node ND1 representing the voltage level at the first node ND1 does not change.

Since the size of the fifth NMOS transistor N5 comprising the first write circuit 320 may be smaller than the first NMOS transistor N1 of the latch circuit 310, the first node ND1 may not be fully charged even though the voltage level of the first write bit line WBL1 is in the high state. If the first node ND1 is in the low state, the first write bit line WBL1 does not affect the first node ND1. However, the first node ND1 is changed to the high state as a result of the second node ND2 having a voltage level opposite to that of the first node ND1.

If the voltage level of the first node ND1 is in the low state, the voltage level of the second node ND2 is in the high state, and charging the first node ND1 to the high state has the same meaning as charging the second node ND2 to the low state. If the voltage level of the first write bit line WBL1 is in the high state, the voltage level of the first complementary write bit line WBLB1 is in the low state. Since the size of the sixth NMOS transistor N6 comprising the second write circuit 330 may be smaller than the second NMOS transistor N2 of the latch circuit 310, the second node ND2 may not be charged to the high state, but there may be no problem in discharging an electric charge of the second node ND2, which is pre-charged to the high state. Thus, the second node ND2 is discharged to the low state, and the first node ND1 is charged to the high state as a reflective effect.

Conversely, if the first node ND1 is intended to be in the low state (that is, if the second node ND2 is intended to be in the high state), the first write bit line WBL1 is in the low state, and the first complementary write bit line WBLB1 has the high state. Since it may be difficult to charge the second node ND2 to the high state, the first node ND1 having an opposite voltage level is discharged to the low state, thereby charging the second node ND2 to the high state as a reflective effect.

All the other write bit lines excluding a predetermined write bit line connected to a recording circuit for recording data in the selected latch circuit are maintained at the high state, so that it may be difficult for data to be recorded in the unselected latch circuit through the recording circuit activated by the first write word line WWL1.

Second, operations for reading data recorded in the latch circuit 310 will be described. In a case where the first read word line RWL1 is in the state "H" and instructs a read operation, only the first virtual ground VGND1 supplied to the read circuit 340 connected to the selected latch circuit 310 is ground voltage. The other virtual grounds VGND2 through VGNDN are in the high state. The read circuit 340 connected to the selected latch circuit 310 inverts the voltage level of the second node ND2 and transmits the voltage to the first read bit line RBL1. The third NMOS transistor N3 and the fourth NMOS transistor N4, which comprise the read circuit 340, constitutes an inverter. The first read bit line RBL1 can transmit data stored in the second node ND2 of the latch circuit 310 to an external device. The other read bit lines RBL2 through RBLN are maintained at the high state as previously described. Thus, only the read circuit 340 connected to the selected latch circuit 310 operates, thereby reducing the occurrence of unnecessary power consumption.

Figure 4:
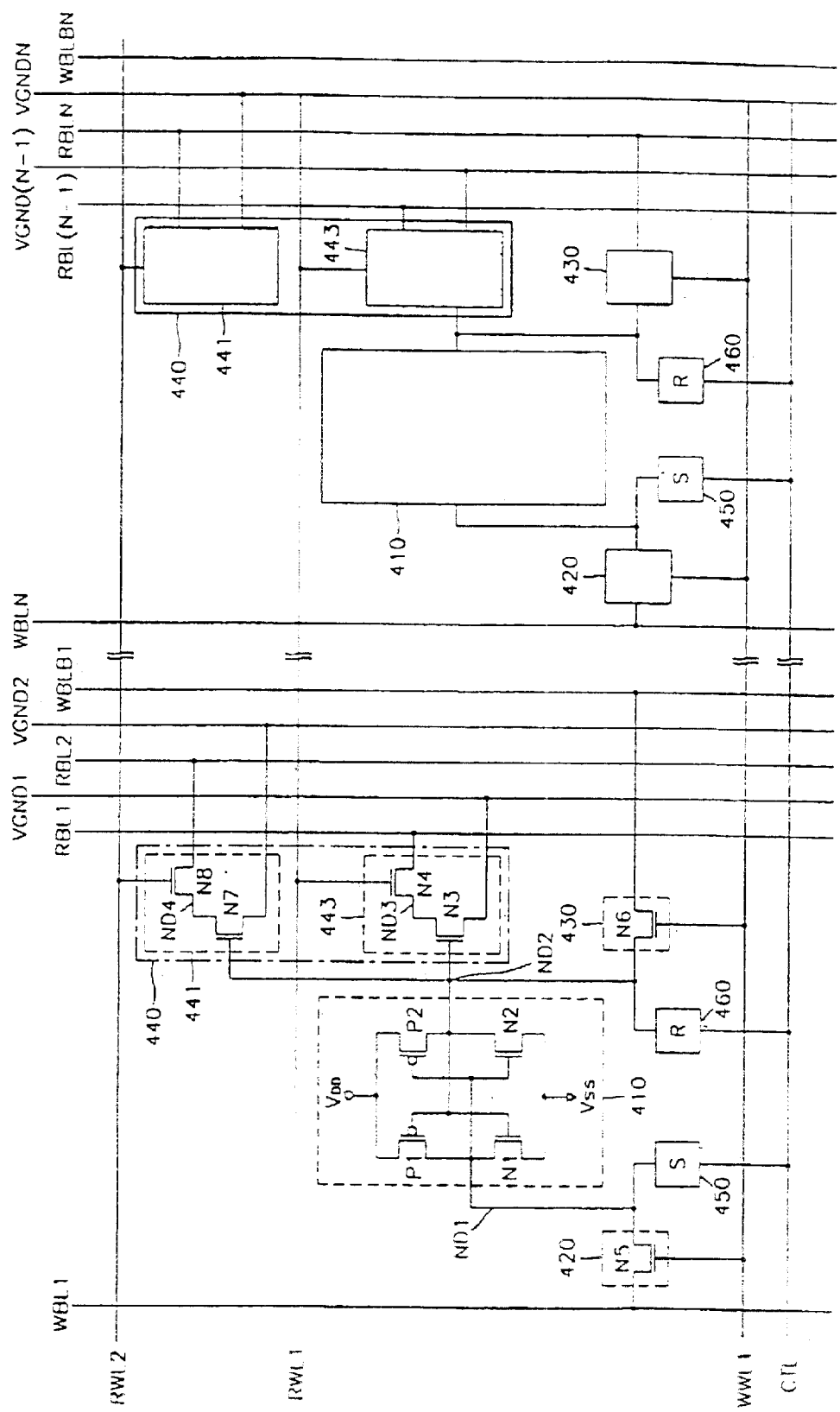
FIG. 4 is a diagram illustrating a semiconductor memory cell according to additional embodiments of the present invention.

FIG. 4 is a diagram illustrating another embodiment of the semiconductor memory cell according to the present invention. Referring to FIG. 4, the semiconductor memory cell includes a latch circuit 410, a first write circuit 420, a second write circuit 430, a read circuit 440, a set circuit 450, and a reset circuit 460.

The latch circuit 410 latches a predetermined voltage which is applied to a first node ND1 and a second node ND2, and the first node ND1 and the second node ND2 have opposite voltage levels. The latch circuit 410 includes two PMOS transistors P1 and P2 and two NMOS transistors N1 and N2.

The PMOS transistor P1 has one source/drain connected to a supply voltage $V_{DD}$, another source/drain connected to the first node ND1 and a gate connected to the second node ND2. The second PMOS transistor P2 has one source/drain connected to a supply voltage $V_{DD}$, another source/drain connected to the second node ND2, and a gate connected to the first node ND1. The first NMOS transistor N1 has one source/drain connected to another supply voltage $V_{ss}$, another source/drain connected to the first node ND1, and a gate connected to the second node ND2. The second NMOS transistor N2 has one source/drain connected to another supply voltage $V_{ss}$, another source/drain connected to the second node ND2, and a gate connected to the first node ND1.

The first write circuit 420 transmits a first external voltage loaded in a first write bit line WBL1 to the first node ND1 in response to a signal of a first write word line WWL1. For this purpose, the first write circuit 420 includes a fifth NMOS transistor N5, which has one source/drain connected to the first write bit line WBL1, another source/drain connected to the first node ND1, and a gate connected to the first write word line WWL1.

The second write circuit 430 transmits a second external voltage loaded in a first complementary write bit line WBLB1 to the second node ND2 in response to a signal of the first write word line WWL1. For this purpose, the second write circuit 430 includes a sixth NMOS transistor N6, which has one source/drain connected to the first complementary write bit line WBLB1, another source/drain connected to the second node ND2, and a gate connected to the first write word line WWL1.

The read circuit 440 includes a first read circuit 443 and a second read circuit 441. The first read circuit 443 inverts the voltage level of the second node ND2 in response to a first read word line RWL1 and transmits the voltage to a first read bit line RBL1. For this purpose, the first read circuit 443 includes a fourth NMOS transistor N4, which has one source/drain connected to the first read bit line RBL1 and a gate connected to the first read word line RWL1, and a third NMOS transistor N3, which has one source/drain connected to the other source/drain of the fourth NMOS transistor N4, another source/drain connected to first virtual ground VGND1, and a gate connected to the second node ND2.

The second read circuit 441 inverts the voltage level of the second node ND2 in response to a second read word line RWL2 and transmits the voltage to a second read bit line RBL2. For this purpose, the second read circuit 441 includes an eighth NMOS transistor N8, which has one source/drain connected to the second read bit line RBL2 and a gate connected to the second read word line RWL2, and a seventh NMOS transistor N7, which has one source/drain connected to the other source/drain of the eighth NMOS transistor N8, another source/drain connected to a second virtual ground VGND2, and a gate connected to the second node ND2.

The first virtual ground VGND1 and the second virtual ground VGND2 are supplied by a multiplexer (not shown) responding to an address (not shown). The first and second virtual ground VGND1 and VGND2 are ground voltages in a case where the first and second virtual grounds VGND1 and VGND2 are connected to a semiconductor memory cell selected from a plurality of semiconductor memory cells for a read operation. The first and second virtual grounds VGND1 and VGND2 are supply voltages $V_{DD}$ in a case where the first and second virtual grounds VGND1 and VGND2 are connected to an unselected semiconductor memory cell during a read operation.

The set circuit 450 sets the first node ND1 to a logic high state "H", and the reset circuit 460 sets the second node ND2 to a logic low state "L" in response to a set/reset signal provide on the control line CTL. A plurality of the semiconductor memory cells according to the present invention can be arranged in a column direction and a row direction in a semiconductor memory device.

The latch circuit 410, the first write circuit 420, and the second write circuit 430 of FIG. 4 are the same as the latch circuit 310, the first write circuit 320, and the second write circuit 330, respectively, of FIG. 3, and thus, further description thereof will be omitted. The read circuit 440 includes the first read circuit 443 and the second read circuit 441, but operations thereof are similar to those of the read circuit 340 of FIG. 3. Embodiments illustrated in FIG. 4 are primarily different in that two pairs of ground voltages VGND1 and VGND2 through VGND(N-1) and VGNDN (where N is an integer) are connected to the read circuit 440, and there are two pairs of read bit lines RBL1 and RBL2 through RBL(N-1) and RBLN (where N is an integer) as a transmission path of data.

Embodiments illustrated in FIG. 4 can be carried out in a case where a user intends to read a plurality of same data from the latch circuit 410 in which arbitrary data are stored. A plurality of read word lines RWL1 and RWL2 can be enabled simultaneously or at different times. The date stored in the second node ND2 of the latch circuit 410 can be read in response to the enabled read word lines RWL1 and/or RWL2. In a case where the same data is transmitted to different devices, a number of read bit lines can be increased by as much as the number of the same data to read from the same latch circuit.

Assuming that a user-intends to read the same data twice from the same latch circuit, for comparison with the prior art, a case where the first read word line RWL1 and the second read word line RWL2 are simultaneously in the high logic state "H" will be described. Referring to FIG. 4, the capacitance of a third node ND3 of the first read circuit 443 and a fourth node ND4 of the second read circuit 441 is the same and is determined by the size of the third NMOS transistor N3 and the fourth NMOS transistor N4 and the size of the seventh NMOS transistor N7 and the eighth NMOS transistor N8, respectively.

Figure 1:
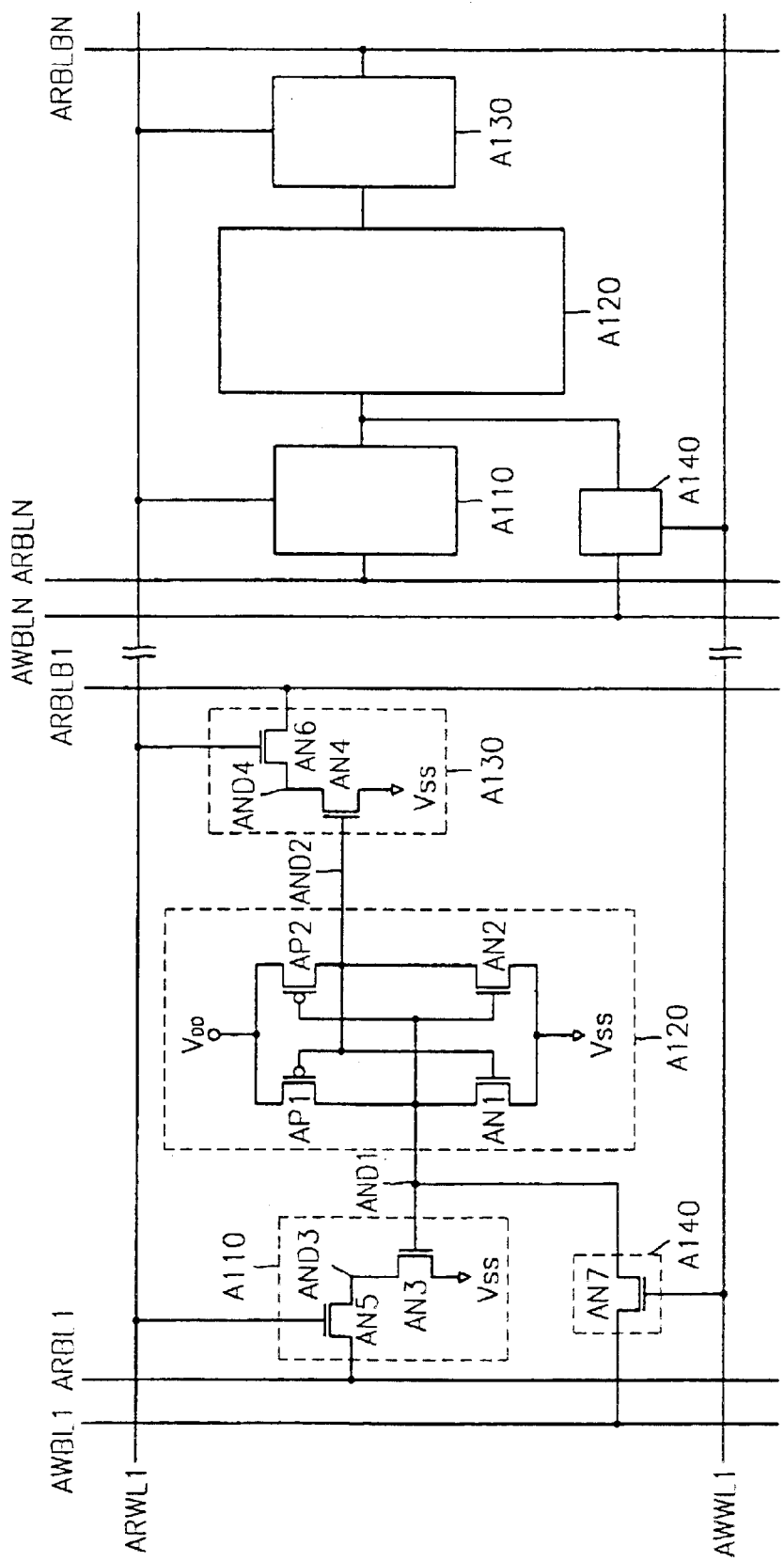
FIG. 1 is a diagram illustrating a conventional semiconductor memory cell connected to a write word line and a read word line.
Figure 2:
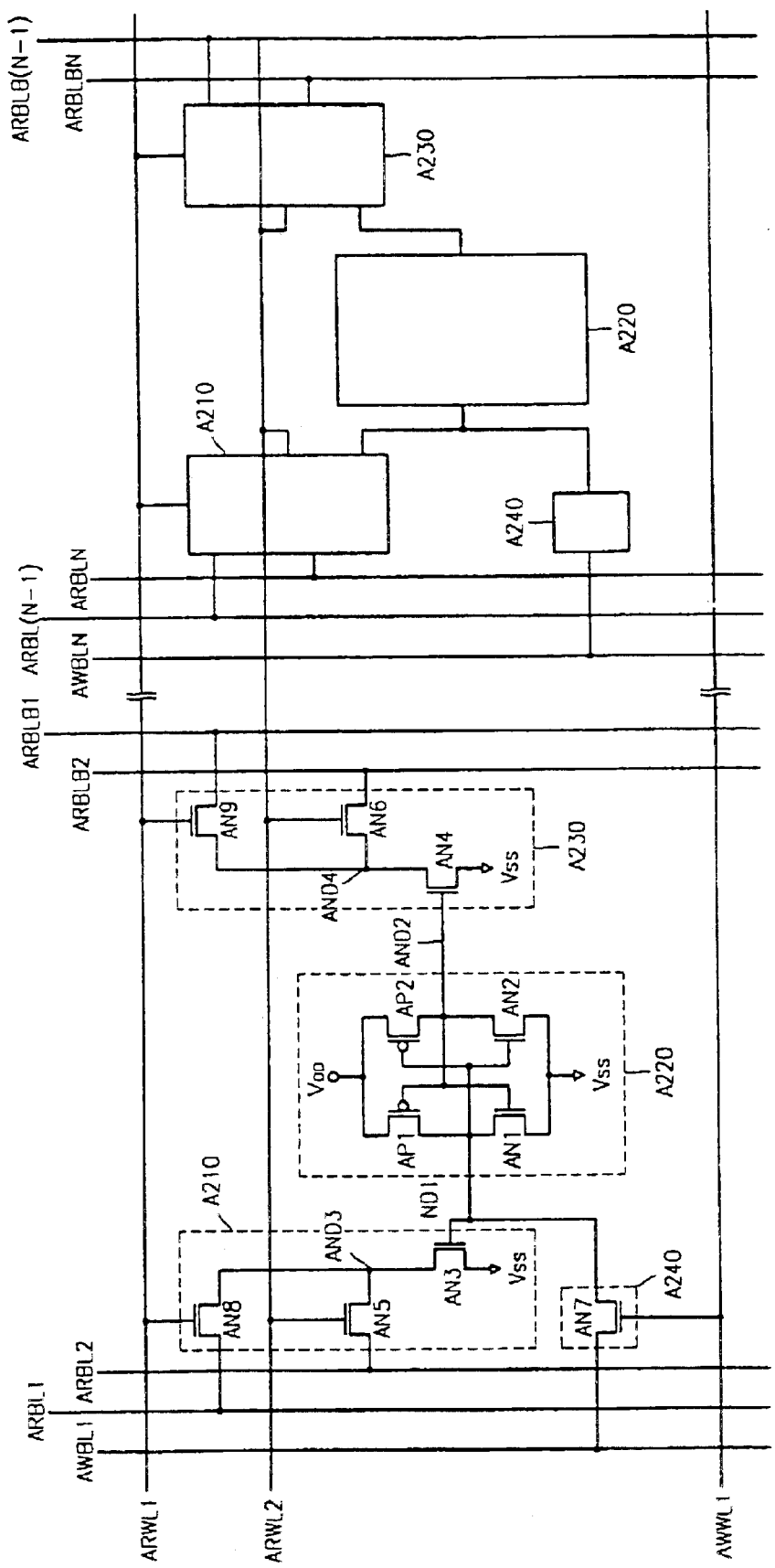
FIG. 2 is a diagram illustrating a conventional semiconductor memory cell connected to a write word line and two read word lines.

Referring to FIG. 2, the substantial capacitance of the third node ND3 and the fourth node ND4 of the read circuit of the conventional semiconductor memory cell may be increased by as much as the number of added NMOS transistors AN8 and AN9 compared to the capacitance of read circuits of the semiconductor memory cells according to embodiments of the present invention. Thus, the semiconductor memory cells according to embodiments of the invention, as illustrated in FIG. 4, may have a plurality of read bit lines and may reduce read times as compared with conventional semiconductor memory cells.

As described above, the semiconductor memory cells according to embodiments of the present invention can reduce power consumption and reduce read time of data when writing/reading data.

According to embodiments of the present invention, a plurality of semiconductor memory cells can be arranged in column and row directions in a semiconductor memory device. Each semiconductor memory cell can be coupled to at least one write word line, at least one write bit line, at least one read word line, at least one read bit line, and at least one virtual ground, and each memory cell can include a latch circuit, a first write circuit, and a read circuit.

The latch circuit can latch a predetermined voltage and can include first and second nodes having opposite voltage levels. The first write circuit can transmit a first external voltage loaded in a first write bit line of the at least one write bit line to the first node in response to a signal of a first write word line of the at least one write word line. The read circuit can invert the voltage level of the second node in response to a signal of a first read word line of the at least one read word line and in response to the at least one virtual ground and can transmit the voltage to a first read bit line of the at least one read bit line.

The virtual ground can latch a first voltage in a case where the virtual ground is connected to a semiconductor memory cell selected from the plurality of semiconductor memory cells, and the virtual ground can latch a second voltage, which is logically opposite to the first voltage, in a case where the virtual ground is connected to an unselected semiconductor memory cell. More particularly, the first voltage can be a ground voltage for the device, and the second voltage can be a supply voltage for the device.

The first write circuit can include a first NMOS transistor, which has one source/drain connected to the first write bit line, and another source/drain connected to the first node, and a gate connected to the first write word line.

The read circuit can include a second NMOS transistor, which has one source/drain connected to the first read bit line and a gate connected to the first read word line, and a third NMOS transistor, which has one source/drain connected to the other source/drain of the second NMOS transistor, another source/drain connected to a first virtual ground, and a gate connected to the second node.

Each semiconductor memory cell may also include a second write circuit for transmitting a second external voltage loaded in a second write bit line of the at least one write bit line to the second node in response to the first write word line. The first external voltage and the second external voltage have logically opposite voltage levels.

The second write circuit can includes a fourth NMOS transistor, which has one source/drain connected to the second node, another source/drain connected to the second write bit line, and a gate connected to the write word line.

The semiconductor memory cell may further include a set circuit for setting the first node and a reset circuit for resetting the second node. The read circuit may further include a fifth NMOS transistor, which has one source/drain connected to a second read bit line of the at least one read bit line and a gate connected to a second read word line of the at least one read word line, and a sixth NMOS transistor, which has one source/drain connected to the other source/drain of the fifth NMOS transistor, another source/drain connected to a second virtual ground, and a gate connected to the second node.

According to embodiments of the present invention, a semiconductor memory cell may be provided such that integration densities and/or performance can be maintained while providing that data is not recorded in an unselected semiconductor memory cell, read time and write time are reduced, and/or power consumption and leakage current can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of writing data to a memory device comprising a plurality of memory cells, wherein each memory cell comprises a latch circuit having first and second complementary latch outputs and first and second write circuits respectively coupled to said first and second latch outputs, the method comprising:

selecting a memory cell to which data is to be written;

activating a write word line coupled to the first and second write circuits of the selected memory cell to which data is to be written;

applying complementary write values to complementary write bit lines of a write bit line pair coupled with the first and second write circuits of the selected memory cell; and responsive to activating the write word line coupled to the first and second write circuits of the selected memory cell to which data is to be written, coupling the first and second latch outputs of the selected memory cell with the complementary write bit lines of the write bit line pair coupled therewith to write the complementary write values to the first and second latch outputs of the selected memory cell, wherein the memory device comprises a plurality of complementary write bit line pairs with bit lines of each pair respectively coupled with first and second write circuits of pluralities of memory cells wherein bit lines of bit line pairs not coupled with the selected memory cell are set at a same value.

2. A method according to claim 1 wherein the bit lines of the complementary write bit line pairs not coupled with the selected memory cell are set at a same high logic value.

3. A method of writing data to a memory device comprising a plurality of memory cells, wherein each memory cell comprises a latch circuit having first and second complementary latch outputs and first and second write circuits respectively coupled to said first and second latch outputs the method comprising:

selecting a memory cell to which data is to be written;

activating a write word line coupled to the first and second write circuits of the selected memory cell to which data is to be written;

applying complementary write values to complementary write bit lines of a write bit line pair coupled with the first and second write circuits of the selected memory cell;

responsive to activating the write word line coupled to the first and second write circuits of the selected memory cell to which data is to be written, coupling the first and second latch outputs of the selected memory cell with the complementary write bit lines of the write bit line pair coupled therewith to write the complementary write values to the first and second latch outputs of the selected memory cell;

generating a control signal on a control Line coupled to a plurality of the memory cells; and responsive to generating the control signal, resetting all of the plurality of the memory cells to a same reset condition.

4. A method according to claim 3 wherein the memory device comprises a plurality of control lines each coupled to a different plurality of memory cells.

5. A memory device comprising:

a plurality of memory cells wherein each memory cell comprises a latch circuit having first and second complementary latch outputs and first and second write circuits respectively coupled to said first and second latch outputs;

a plurality of write word lines wherein each write word line is coupled with the first and second write circuits of a respective plurality of memory cells;

a plurality of complimentary write bit line pairs wherein write bit lines of each complimentary write bit line pair are respectively coupled with the first and second write circuits of a plurality of memory cells; and a controller that selects a memory cell to which data is to be written, activates a write word line coupled to the first and second write circuits of the selected memory cell to which data is to be written, and applies complementary write values to complementary write bit lines of a write bit line pair coupled with the first and second write circuits of the selected memory cell, so that the first and second latch outputs of the selected memory cell are coupled with the complementary write bit lines of the write bit line pair coupled therewith to write the complementary write values to the first and second latch outputs of the selected memory cell responsive to activating the write word line coupled to the first and second write circuits of the selected memory cell wherein the controller applies a same value to complementary bit lines of complementary bit line pairs not coupled with the selected memory cell.

6. A memory device according to claim 5 wherein the controller applies a same high logic value to complementary write bit lines of the complementary write bit line pairs not coupled with the selected memory cell.

7. A memory device according to claim 5 wherein the first write circuit of a memory cell comprises a first transistor having a first source/drain coupled to the first latch output, a second source/drain coupled to the first write bit line of the complementary write bit line pair, and a gate coupled to the write word line, and wherein the second write circuit of the memory cell comprises a second transistor having a third source/drain coupled to the second latch output, a fourth source/drain coupled to the second write bit line of the complementary write bit line pair, and a gate coupled to the write word line.

8. A memory device comprising:
a plurality of memory cells wherein each memory cell comprises a latch circuit having first and second complementary latch outputs and first and second write circuits respectively coupled to said first and second latch outputs and wherein each memory cell comprises a set/reset circuit:
a plurality of write word lines wherein each write word line is coupled with the first and second write circuits of a respective plurality of memory cells;
a plurality of complimentary write bit line pairs wherein write bit lines of each complimentary write bit line pair are respectively coupled with the first and second write circuits of a plurality of memory cells; and
a controller that selects a memory cell to which data is to be written, activates a write word line coupled to the first and second write circuits of the selected memory cell to which data is to be written, and applies complementary write values to complementary write bit lines of a write bit line pair coupled with the first and second write circuits of the selected memory cell, so that the first and second latch outputs of the selected memory cell are coupled with the complementary write bit lines of the write bit line pair coupled therewith to write the complementary write values to the first and second latch outputs of the selected memory cell responsive to activating the write word line coupled to the first and second write circuits of the selected memory cell; and
a plurality of control lines wherein each control line is coupled to set/reset circuits of a respective plurality of memory cells and wherein the set/reset circuits coupled to a control line reset the respective memory cells to a same set/reset condition responsive to a control signal on the respective control line.

9. A memory device comprising:
a plurality of memory cells wherein each memory cell comprises a latch circuit having first and second complementary latch outputs and first and second write circuits respectively coupled to said first and second latch outputs wherein the latch circuit of each memory cell is coupled to a read circuit;
a plurality of write word lines wherein each write word line is coupled with the first and second write circuits of a respective plurality of memory cells;
a plurality of complimentary write bit line pairs wherein write bit lines of each complimentary write bit line pair are respectively coupled with the first and second write circuits of a plurality of memory cells;
a controller that selects a memory cell to which data is to be written, activates a write word line coupled to the first and second write circuits of the selected memory cell to which data is to be written, and applies complementary write values to complementary write bit lines of a write bit line pair coupled with the first and second write circuits of the selected memory cell, so that the first and second latch outputs of the selected memory cell are coupled with the complementary write bit lines of the write bit line pair coupled therewith to write the complementary write values to the first and second latch outputs of the selected memory cell responsive to activating the write word line coupled to the first and second write circuits of the selected memory cell;
a plurality of virtual ground lines wherein each virtual ground line is coupled with read circuits of a respective plurality of memory cells; and
wherein the controller selects a memory cell from which data is to be read, applies a first reference voltage to a virtual ground line coupled to the selected memory cell from which data is to be read, applies a second reference voltage to a virtual ground line not coupled to the selected memory cell, and activates a read word line coupled to the read circuit of the selected memory cell from which data is to be read, so that data is coupled from the latch circuit of the selected memory cell with a respective read bit line through the read circuit of the selected memory cell responsive to activating the read word line coupled to the read circuit of the selected memory cell.

10. A semiconductor memory cell of a plurality of semiconductor memory cells that are arranged in a column direction and a row direction in a semiconductor memory device, the semiconductor memory cell comprising:
at least one write word line;
at least one write bit line;
at least one read word line;
at least one read bit line;
at least one virtual ground;
a latch circuit for latching a predetermined voltage and including first and second nodes having opposite voltage levels;
a first write circuit for transmitting a first external voltage loaded in a first write bit line of the at least one write bit line to the first node in response to a signal of a first write word line of the at least one write word line; and
a read circuit for inverting the voltage level of the second node in response to a signal of a first read word line of the at least one read word line and in response to the at least one virtual ground and transmitting the voltage to a first read bit line of the at least one read bit line;
wherein the virtual ground latches a first voltage in a case where the virtual ground is connected to a semiconductor memory cell selected from the plurality of semiconductor memory cells, and the virtual ground latches a second voltage, which is logically opposite to the first voltage, in a case where the virtual ground is connected to an unselected semiconductor memory cell.

11. The semiconductor memory cell as claimed in claim 10, wherein the first voltage is a ground voltage, and the second voltage is a supply voltage.

12. The semiconductor memory cell as claimed in claim 10, wherein the first write circuit includes a first NMOS transistor, which has one end connected to the first write bit line, and another end connected to the first node, and a gate connected to the first write word line.

13. The semiconductor memory cell as claimed in claim 10, wherein the read circuit comprises;
- a second NMOS transistor, which has one end connected to the first read bit line and a gate connected to the first read word line; and
- a third NMOS transistor, which has one end connected to the other end of the second NMOS transistor, another end connected to a first virtual round, and a gate connected to the second node.

14. The semiconductor memory cell as claimed in claim 10, further comprising a second write circuit for transmitting second external voltage loaded in a second write bit line of the at least one write bit line to the second node in response to the first write word line, wherein the first external voltage and the second external voltage have logically opposite voltage levels.

15. The semiconductor memory cell as claimed in claim 14, wherein the second write circuit includes a fourth NMOS transistor, which has one end connected to the second node, another end connected to the second write bit line, and a gate connected to the write word line.

16. The semiconductor memory cell as claimed in claim 10, further comprising a set circuit for setting the first node.

17. The semiconductor memory cell as claimed in claim 10, further comprising a reset circuit for resetting the second node.

18. The semiconductor memory cell as claimed in claim 10, wherein the read circuit further comprises:

- a fifth NMOS transistor, which has one end connected to a second read bit line of the at least one read bit line and a gate connected to a second read word line of the at least one read word line; and
- a sixth NMOS transistor, which has one end connected to the other end of the fifth NMOS transistor, another end connected to a second virtual ground, and a gate connected to the second node.

19. A semiconductor memory cell comprising:
- a write word line;
- a write bit line;
- a read word line;
- a read bit line;
- a virtual ground;
- a latch circuit for latching a predetermined voltage and including first and second nodes having opposite voltage levels;
- a write circuit for transmitting a first external voltage loaded in the write bit line to the first node in response to a signal of the write word line; and
- a read circuit for inverting the voltage level of the second node in response to a read signal on the read word line and the virtual ground and transmitting the voltage to the read bit line,
wherein the virtual ground is ground voltage or a supply voltage which can be changed, wherein the virtual around line is set to a first of the ground voltage or the supply voltage when the read signal is on the read word line and the latch is selected for a read operation and wherein the virtual around line is set to a second of the ground voltage or the supply voltage when the read signal is on the read word line and the latch is not selected for a read operation.

* * * * *

UNITED STATES PATENT AND TRADEMARK OFFICE
CERTIFICATE OF CORRECTION

PATENT NO.    : 6,798,700 B2
DATED         : September 28, 2004
INVENTOR(S)   : Jeung It is certified that error appears in the above-identified patent and that said Letters Patent is hereby corrected as shown below:

Column 10,
Line 39, should read -- generating a control signal on a control line coupled to a --

Column 14,
Line 28, should read -- ground line is set to a first of the ground voltage or the --
Line 31, should read -- wherein the virtual ground line is set to a second of the --

Signed and Sealed this

Twenty-sixth Day of April, 2005

JON W. DUDAS
*Director of the United States Patent and Trademark Office*